United States Patent
Wahlroos et al.

(10) Patent No.: US 8,717,036 B2
(45) Date of Patent: May 6, 2014

(54) METHOD AND APPARATUS FOR DETECTING A PHASE-TO-EARTH FAULT

(75) Inventors: Ari Wahlroos, Vaasa (FI); Janne Altonen, Toijala (FI)

(73) Assignee: ABB Technology AG, Zurich (CH)

( * ) Notice: Subject to any disclaimer, the term of this patent is extended or adjusted under 35 U.S.C. 154(b) by 568 days.

(21) Appl. No.: 13/113,708

(22) Filed: May 23, 2011

(65) Prior Publication Data

US 2011/0298468 A1    Dec. 8, 2011

Related U.S. Application Data

(63) Continuation of application No. PCT/FI2009/050942, filed on Nov. 20, 2009.

(30) Foreign Application Priority Data

Nov. 26, 2008    (EP) .................................... 08169969

(51) Int. Cl.
    *H02H 3/16*      (2006.01)
    *H02H 5/10*      (2006.01)
    *G01R 31/08*     (2006.01)

(52) U.S. Cl.
    CPC ............... *H02H 3/165* (2013.01); *H02H 5/105* (2013.01); *G01R 31/086* (2013.01)
    USPC ........................................................ 324/509

(58) Field of Classification Search
    CPC .......... H02H 3/16; H02H 3/165; H02H 5/105
    USPC ........................................................ 324/509
    See application file for complete search history.

(56) References Cited

U.S. PATENT DOCUMENTS

| 4,809,123 | A  | * | 2/1989 | Allington et al. ................ 361/42 |
| 7,514,933 | B2 | * | 4/2009 | Altonen et al. ................ 324/522 |
| 7,940,054 | B2 | * | 5/2011 | Labuschagne et al. ....... 324/509 |
| 2003/0081364 | A1 | | 5/2003 | Stoupis et al. | |

(Continued)

FOREIGN PATENT DOCUMENTS

| EP | 1 195 875 A | 4/2002 |
| WO | WO 03/023429 A | 3/2003 |

OTHER PUBLICATIONS

International Search Report (PCT/ISA/210) for PCT/FI2009/050942 dated May 12, 2010.

(Continued)

*Primary Examiner* — Jeff Natalini
(74) *Attorney, Agent, or Firm* — Buchanan Ingersoll & Rooney PC

(57) ABSTRACT

A method and an apparatus for detecting a phase-to-earth fault on a three-phase electric line of an electric network, the apparatus determining a neutral admittance based on a ratio of a difference between zero sequence currents on the three-phase electric line and a difference between zero sequence voltages in the electric network before an earth fault and during the earth fault. The apparatus also compares the determined neutral admittance, to a predetermined operation characteristic to detect a phase-to-earth fault on the three-phase electric line. The predetermined operation characteristic, when presented on an admittance plane, defines a closed area such that the center of the closed area is offset from the origin of the admittance plane towards a negative susceptance direction and/or towards a negative conductance direction.

15 Claims, 4 Drawing Sheets

(56) References Cited

U.S. PATENT DOCUMENTS

2004/0021995 A1* 2/2004 Roberts et al. ............... 361/42
2008/0174316 A1* 7/2008 Wahlroos et al. ............ 324/522
2008/0211511 A1* 9/2008 Choi et al. ................... 324/522
2008/0284447 A1* 11/2008 Wahlroos et al. ............ 324/522

OTHER PUBLICATIONS

Written Opinion (PCT/ISA/237) for PCT/FI2009/050942 dated May 12, 2010.
European Search Report for EP 08169969 dated May 8, 2009.

* cited by examiner

METHOD AND APPARATUS FOR DETECTING A PHASE-TO-EARTH FAULT

RELATED APPLICATION

This application claims priority as a continuation application under 35 U.S.C. §120 to PCT/FI2009/050942, which was filed as an International Application on Nov. 20, 2009 designating the U.S., and which claims priority to European Patent Application No. 08169969.6 filed in Europe on Nov. 26, 2008. The entire contents of these applications are hereby incorporated by reference in their entireties.

FIELD

The present disclosure relates to fault detection, such as, detecting a phase-to-earth fault on a three-phase electric line of an electric network.

BACKGROUND INFORMATION

In countries, such as Poland, neutral admittance protection has become a common earth fault protection function in efforts to provide better effectiveness in earth fault detection when compared to the traditional residual current based earth fault protection in unearthed and compensated distribution networks.

In "Admittance criteria for earth fault detection in substation automation systems in Polish distribution power networks", J. Lorenc et. al, CIRED 97, Birmingham, June 1997, discloses examples of the implementation of the neutral admittance based earth fault protection and mentions that until mid-1996 over 2000 neutral admittance protection systems have been installed in Poland.

Neutral admittance protection is based on evaluating the quotient $\overline{Y}_0 = 3\overline{I}_0/\overline{U}_0$, i.e. neutral admittance of the network, and comparing the result with operating boundaries in an admittance plane. Residual current $3\overline{I}_0$ can be measured with a cable core transformer and residual voltage $\overline{U}_0$ is measured from open-delta connected tertiaries of single-pole isolated voltage transformers.

The admittance protection found in existing protection relay terminals can specify that the user select the operation criteria from several possibilities such as 1) over-admittance, 2) over-conductance (non-directional or forward/reverse directional) without/with tilt, 3) over-susceptance (non-directional or forward/reverse directional) without/with tilt or any combination of criteria 1 through 3 (symmetrical around the origin) as desired. FIG. 1 illustrates examples of operation characteristics of existing admittance protection functions presented on an admittance plane (B is susceptance and G is conductance). The shaded area in each of the operation characteristics determines the normal or non-operation area such that, if the neutral admittance is within this area, the protection does not operate and, if the neutral admittance is outside this area, then the protection operates. For example, as shown in FIG. 1, the over-admittance operation characteristic can be defined by setting an absolute value $Y_{set}$ of admittance $\overline{Y}$, which defines a circle on the admittance plane as shown. The over-conductance operation characteristic can be defined by lower ($-G_{set}$) and upper ($+G_{set}$) conductance settings and a tilt may be further set with an angle setting $\alpha$ as shown. In a similar manner, the over-susceptance operation characteristic can be defined by lower ($-B_{set}$) and upper ($+B_{set}$) susceptance settings and a tilt can be further set with an angle setting $\alpha$. It should be noted that in the over-conductance and over-susceptance characteristics illustrated in FIG. 1, the shaded non-operation area and the lines defining them have been shown only partly, for the sake of clarity. In addition, different combinations of the operation characteristics can be formed by combining the settings such that, e.g., both the over-conductance and over-susceptance settings are applied at the same time.

In existing solutions, the operation characteristic to be used depends on the network neutral point treatment. For example, in isolated networks the over-susceptance criteria should be applied. In compensated networks it is advised to use the over-conductance based criteria. This means that a relay terminal with admittance protection functionality requires many settings which need to be set according to the network properties. The many settings and possibly difficult setting calculation procedures are a problem with such existing solutions.

SUMMARY

An exemplary embodiment is directed to a method for detecting a phase-to-earth fault on a three-phase electric line of an electric network. The method comprises monitoring a zero sequence current on the three-phase electric line and a zero sequence voltage in the electric network, detecting an earth fault in the electric network based on a value of the zero sequence voltage, determining a difference between a first zero sequence current monitored before the earth fault and a second zero sequence current monitored during the earth fault, determining a difference between a first zero sequence voltage value monitored before the earth fault and a second zero sequence voltage value monitored during the earth fault. The method also includes determining a neutral admittance, based on a ratio between a difference between the first and second zero sequence currents and the difference between the first and second zero sequence voltages, and comparing the determined neutral admittance, to a predetermined operation characteristic to detect a phase-to-earth fault on the three-phase electric line. The predetermined operation characteristic, when presented on an admittance plane, defines a closed area such that the center of the closed area is offset from the origin of the admittance plane towards a negative susceptance direction and/or towards a negative conductance direction.

Another exemplary embodiment is direct to apparatus for detecting a phase-to-earth fault on a three-phase electric line of an electric network. The apparatus comprises means for monitoring a zero sequence current on the three-phase electric line and a zero sequence voltage in the electric network, means for detecting an earth fault in the electric network based on the zero sequence voltage value, and means for determining a difference between a first zero sequence current before the earth fault and a second zero sequence current during the earth fault. The apparatus also includes means for determining a difference between a first zero sequence voltage before the earth fault and a second zero sequence voltage during the earth fault, means for determining a neutral admittance, based on a ratio of a difference between the first and second zero sequence currents and a difference between the first and second zero sequence voltages, and means for comparing the determined neutral admittance to a predetermined operation characteristic to detect a phase-to-earth fault on the three-phase electric line. The predetermined operation characteristic, when presented on an admittance plane, defines a closed area such that a center of the closed area is offset from an origin of the admittance plane towards a negative susceptance direction and/or towards a negative conductance direction.

An exemplary embodiment is directed to an apparatus for detecting a phase-to-earth fault on a three-phase electric line of an electric network. The apparatus comprises a monitoring unit configured to monitor a zero sequence current on the three-phase electric line and a zero sequence voltage in the electric network, a detection unit configured to detect an earth fault in the electric network based on the zero sequence voltage value, and a determination unit. The determination unit is configured to: determine a difference between a first zero sequence current before the earth fault and a second zero sequence current during the earth fault, determine a difference between a first zero sequence voltage before the earth fault and a second zero sequence voltage during the earth fault, and determine a neutral admittance, based on a ratio of a difference between the first and second zero sequence currents and a difference between the first and second zero sequence voltages. The Apparatus also includes a comparison unit configured to compare the determined neutral admittance, to a predetermined operation characteristic to detect a phase-to-earth fault on the three-phase electric line. The predetermined operation characteristic, when presented on an admittance plane, defines a closed area such that a center of the closed area is offset from an origin of the admittance plane towards a negative susceptance direction and/or towards a negative conductance direction.

BRIEF DESCRIPTION OF THE DRAWINGS

In the following the disclosure will be described in greater detail by means of exemplary embodiments with reference to the accompanying drawings, in which.

DETAILED DESCRIPTION

An object of the present disclosure is to provide a method and an apparatus for implementing the method to address or alleviate the problems discussed above.

The embodiments of the present disclosure are directed to utilizing zero sequence currents and voltages before an earth fault and during the earth fault for determining a neutral admittance, and comparing the determined neutral admittance, or a quantity indicative thereof, to a predetermined operation characteristic to detect a phase-to-earth fault on the three-phase electric line. The predetermined operation characteristic, when presented on an admittance plane, defines a closed area such that the center of the closed area is offset from the origin of the admittance plane towards a negative susceptance direction and/or towards a negative conductance direction.

An advantage of the exemplary embodiments of the present disclosure is that they provide a simplified operation function and characteristic, which can at the same time be valid for unearthed networks, high resistance earthed and/or compensated networks. Therefore, no change in the setting values are needed, if the earthing method is changed, for example, by disconnection of a compensation coil. In addition, the disclosure provides immunity against fault resistance and system unbalance by using delta-quantities in neutral admittance calculation. Therefore, a high sensitivity in terms of how high fault resistance can be detected can be obtained.

The exemplary embodiments of the disclosure are not limited to any specific system, and can be used in connection with various three-phase electric systems to detect a phase-to-earth fault on a three-phase electric line of an electric network. The electric line can be a feeder, for example, and it can be an overhead-line or a cable or a combination of both as desired. The electric power system in which the disclosure is implemented can be an electric transmission or distribution network or a component thereof, for example, and can comprise several feeders or sections. Moreover, the use of the disclosure is not limited to systems employing 50 Hz or 60 Hz fundamental frequencies or to any specific voltage level.

Figure 1:
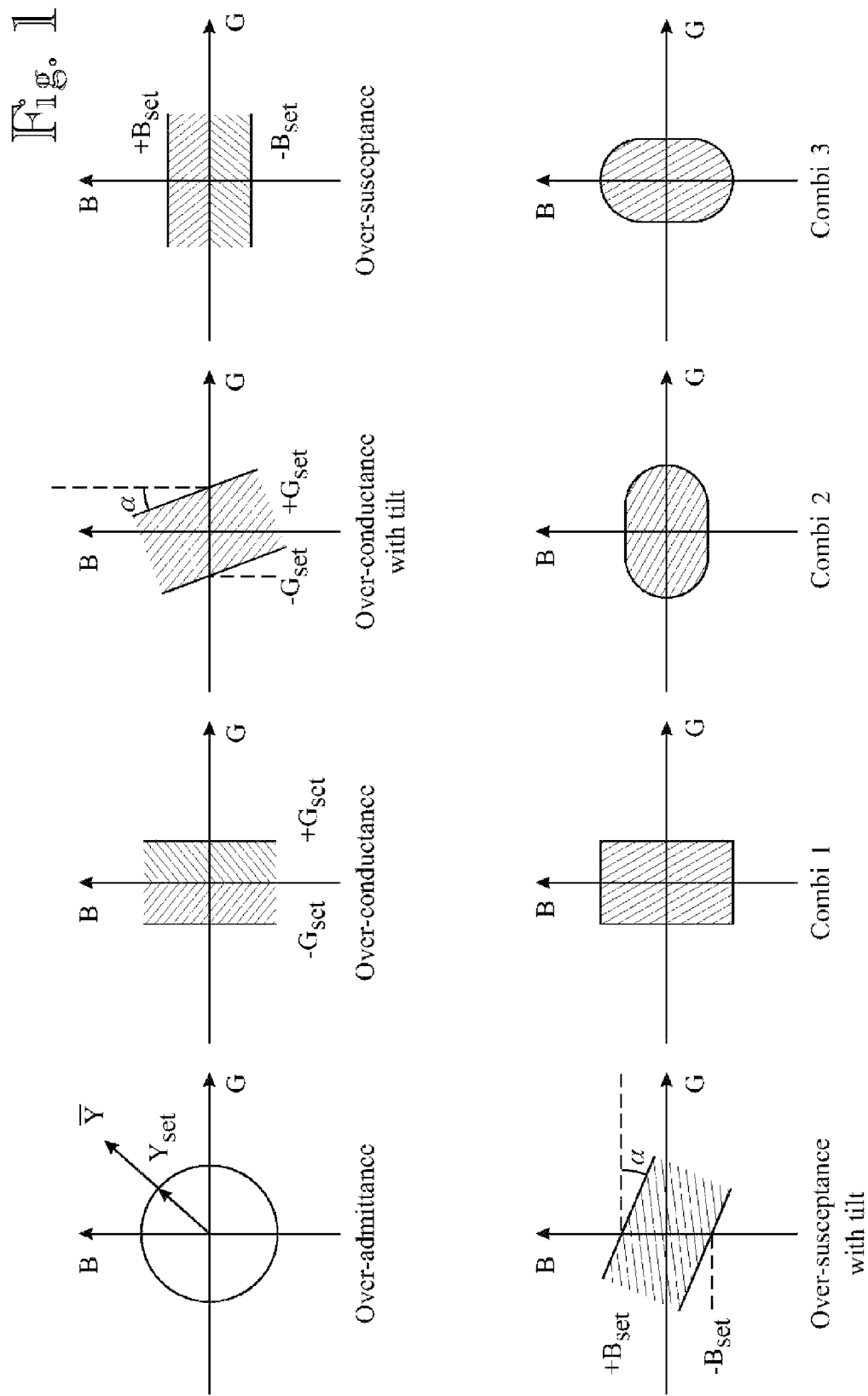
FIG. 1 illustrates examples of operation characteristics of admittance protection functions in accordance with the prior art.
Figure 2:
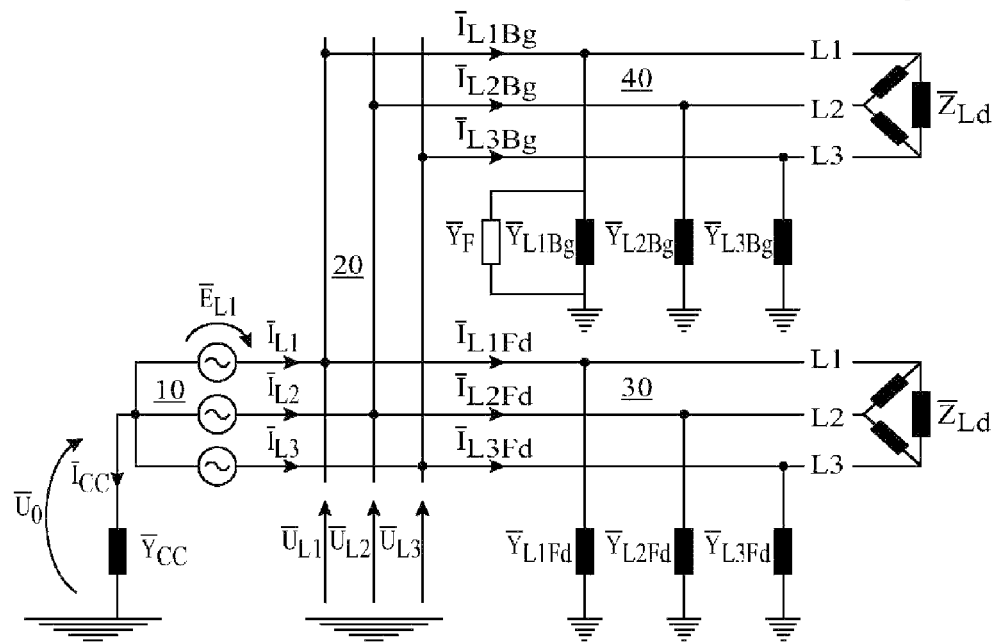
FIG. 2 illustrates an equivalent circuit for a three-phase electric network in accordance with an exemplary embodiment.
Figure 3:
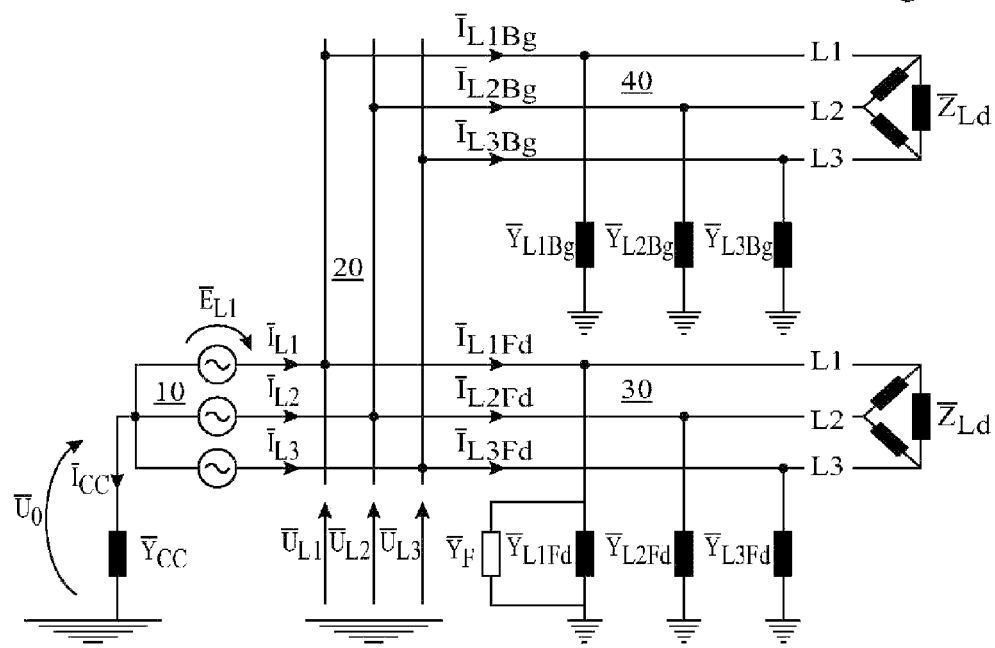
FIG. 3 illustrates an equivalent circuit for a three-phase electric network in accordance with an exemplary embodiment.

FIGS. 2 and 3 illustrate equivalent circuits for a three-phase electric network in accordance with exemplary embodiments. FIG. 2 shows a situation in which there is a fault in the background network and FIG. 3 shows a situation in which there is a fault in the electric line to be monitored. The figures show only the components necessary for understanding the disclosure. The exemplary network can be a medium voltage (e.g. 20 kV) distribution network fed through a substation comprising a transformer 10 and a busbar 20. The illustrated network can also comprise electric line outlets, e.g., feeders, of which one 30 is shown separately. Other possible feeders as well as other network parts, except the line 30, are referred to as a 'background network' and have been represented by a single line outlet 40. It should be noted that there may be any number of feeders or other network elements in the background network as desired. There may also be several feeding substations. Further, the exemplary embodiments of the present disclosure can be utilized with a switching station without a transformer 10, for example. The network is a three-phase network and the three phases of the three-phase electricity system are referred to as L1, L2, and L3. In the exemplary system the functionality of the disclosure can be located in a possible relay unit (not shown) located at the beginning of the line 30, e.g., in the connection point between the line 30 and the busbar 20. In an exemplary embodiment, some measurements are performed in the location of such a unit and the results are then transmitted to another unit or units in another location for further processing. Thus, the functionality of the embodiments of the present disclosure could be distributed among two or more physical units instead of just one unit and also the unit or units implementing the exemplary embodiments of the present disclosure can be located in connection with the electric line 30 to be protected or possibly in a remote location. The notations used in FIGS. 2 and 3 are as follows:

$\overline{U}_0$=Zero-sequence voltage of the network
$\overline{E}_{L1}$=Phase L1 source voltage
$\overline{E}_{L2}$=Phase L2 source voltage
$\overline{E}_{L3}$=Phase L3 source voltage
$\overline{I}_{CC}$=Current through the earthing arrangement (compensation coil plus parallel resistor)
$\overline{Y}_{CC}$=Admittance of the earthing arrangement (compensation coil plus parallel resistor)
$\overline{I}_{L1}$=Phase current of phase L1 measured at infeed
$\overline{I}_{L2}$=Phase current of phase L2 measured at infeed
$\overline{I}_{L3}$=Phase current of phase L3 measured at infeed
$\overline{I}_{L1Fd}$=Phase current of phase L1 of the electric line
$\overline{I}_{L2Fd}$=Phase current of phase L2 of the electric line $I_{L3Fd}$=Phase current of phase L3 of the electric line
$I_{L1Bg}$=Phase current of phase L1 of the background network
$I_{L2Bg}$=Phase current of phase L2 of the background network
$I_{L3Bg}$=Phase current of phase L3 of the background network
$U_{L1}$=Phase voltage of phase L1 at the substation
$U_{L2}$=Phase voltage of phase L2 at the substation
$U_{L3}$=Phase voltage of phase L3 at the substation
$\overline{Y}_F$=Fault admittance (assumed to be pure conductance)
$\overline{Y}_{L1Fd}$=Admittance of phase L1 of the electric line
$\overline{Y}_{L2Fd}$=Admittance of phase L2 of the electric line
$\overline{Y}_{L3Fd}$=Admittance of phase L3 of the electric line
$\overline{Y}_{L1Bg}$=Admittance of phase L1 of the background network
$\overline{Y}_{L2Bg}$=Admittance of phase L2 of the background network
$\overline{Y}_{L3Bg}$=Admittance of phase L3 of the background network
$\overline{Z}_{Ld}$=Phase impedance of a delta connected load Monitored current and voltage values can be obtained by a suitable measuring arrangement including, e.g., current and voltage transducers (not shown in the figures) connected to the phases of the electricity system. In most of the existing protection systems, these values are readily available and thus the implementation of the disclosure does not necessarily specify any separate or specific measuring arrangements. How such values are obtained may depend on the particular electricity system to be monitored.

The exemplary embodiments of the present disclosure utilizes the calculation of neutral admittance $\overline{Y}_0$, that is, the quotient of residual current $3\overline{I}_0$ ($\overline{I}_0$ is the zero sequence current) measured at the beginning of the electric line 30 ($3\overline{I}_0 = \overline{I}_{L1Fd} + \overline{I}_{L2Fd} + \overline{I}_{L3Fd}$) and residual voltage $\overline{U}_0$ (with negative sign). According to an exemplary embodiment, the calculation of the neutral admittance can include "delta"-quantities, where t1 and t2 refer to two separate instances in time, before (t1) and during (t2) the fault:

$$\overline{Y}_{0\Delta} = \frac{3 \cdot (\overline{I}_{0\_t2} - \overline{I}_{0\_t1})}{-(\overline{U}_{0\_t2} - \overline{U}_{0\_t1})} \quad (1)$$

The neutral admittance calculation (e.g. according to equation 1) can be initiated as soon as an earth fault is detected. An earth fault in the electric network can be detected on the basis of the zero sequence voltage. It can be done in two alternative ways: either when amplitude of the residual voltage exceeds a pre-set value $U_{0set}$:

$$|\overline{U}_0| > U_{0set} \quad (2)$$

or when a change in the residual voltage exceeds a pre-set value $U_{0Dset}$:

$$|\overline{U}_{0\_t2}| - |\overline{U}_{0\_t1}| > U_{0\Delta set} \quad (3)$$

The advantage of using equation 3 as a start criterion is the fact that due to network asymmetry, a large magnitude residual voltage can exist in the network during the healthy state. This may lead to a very high value of $U_{0set}$, which in turn results in insensitivity of the fault detection. By applying equation 3, the start criterion is based on change, not on the absolute value, and therefore sensitivity of fault detection is increased.

With reference to FIG. 2, when a single-phase earth fault occurs outside the electric line 30, the measured neutral admittance equals to the total line admittance (sum of all phase admittances) with a negative sign:

$$\overline{Y}_{0\Delta} = -\overline{Y}_{Fdtot} = -(G_{FDtot} + j \cdot B_{Fdtot}) \quad (4)$$

where
$\overline{Y}_{Fdtot}$=the total line admittance
$G_{Fdtot}$=the total line conductance
$B_{Fdtot}$=the total line susceptance $$\overline{Y}_{Fdtot} = \overline{Y}_{L1Fd} + \overline{Y}_{L2Fd} + \overline{Y}_{L3Fd}$$

$$\overline{Y}_{L1Fd} = G_{L1Fd} + j \cdot B_{L1Fd}$$

$$\overline{Y}_{L2Fd} = G_{L2Fd} + j \cdot B_{L2Fd}$$

$$\overline{Y}_{L3Fd} = G_{L3Fd} + j \cdot B_{L3Fd}$$

$G_{L1Fd}$=Phase-to-earth conductance of phase L1 of the electric line
$G_{L2Fd}$=Phase-to-earth conductance of phase L2 of the electric line
$G_{L3Fd}$=Phase-to-earth conductance of phase L3 of the electric line
$B_{L1Fd}$=Phase-to-earth susceptance of phase L1 of the electric line
$B_{L2Fd}$=Phase-to-earth susceptance of phase L2 of the electric line
$B_{L3Fd}$=Phase-to-earth susceptance of phase L3 of the electric line In practice, the conductance term $\text{real}(\overline{Y}_{Fdtot}) = G_{Fdtot} = (G_{L1Fd} + G_{L2Fd} + G_{L3Fd})$ is very small due to small resistive leakage losses of conductors. At least in networks with over-headlines, the losses may be so small that conductance cannot be measured accurately. In this case, only the susceptance term $\text{imag}(\overline{Y}_{Fdtot}) = B_{Fdtot} = (B_{L1Fd} + B_{L2Fd} + B_{L3Fd}) = w \cdot (C_{0L1} + C_{0L2} + C_{0L3})$ is valid. The admittance protection characteristic should be set so that the measured neutral admittance during outside fault stays inside the operation characteristics (=protection does not operate). An outside fault means that the fault is located outside the protected electric line 30. This can be achieved by setting the admittance characteristic so that the characteristic always covers the total line admittance of the electric line. The value for the total line admittance (sum of all phase admittances) can be determined on the basis of the earth-fault current value of the electric line:

$$\overline{Y}_{Fdtot} \approx j * 3 \cdot I_{0Fd} / U_{phase}, \quad (5)$$

where
$3 \cdot I_{0Fd}$=magnitude of the earth-fault current supplied by the line in case of an outside fault ($R_F = 0$ ohm)
$U_{phase}$=nominal phase-to-earth voltage of the network IN another exemplary embodiment, the total line admittance can be determined by calculating the neutral admittance based on changes in the residual current and voltage during the healthy state. These changes can be due to e.g. altering the compensation coil tuning or switching of the parallel resistor of the compensation coil (on or off):

$$\overline{Y}_{Fdtot} = \frac{3 \cdot (\overline{I}_{0\_h2} - \overline{I}_{0\_h1})}{-(\overline{U}_{0\_h2} - \overline{U}_{0\_h1})}, \quad (2)$$

where
$3 * \overline{I}_{0\_h1}$=residual current prior to the change during healthy state
$3 * \overline{I}_{0\_h2}$=residual current after the change during healthy state
$\overline{U}_{0\_h1}$=residual voltage prior to the change during healthy state $U_{0\_h2}$=residual voltage after the change during healthy state This embodiment has the advantage that admittance characteristic settings could be updated utilizing equation 6 so that the settings, and thus the characteristic, match the current switching state of the electric line i.e. the total line admittance is covered by the admittance characteristic. The updating can be performed in real time, i.e. always when the switching state of the three-phase electric line changes. Alternatively, the updating can be performed at predetermined intervals, for example.

With reference to FIG. 3, when a single-phase earth fault occurs inside the electric line 30, the measured neutral admittance equals to the admittance of the background network 40 plus the compensation coil including a parallel resistor:

$$\overline{Y}_{0\Delta} = \overline{Y}_{Bgtot} + \overline{Y}_{CC} \qquad (7)$$

where $$\overline{Y}_{Bgtot} = \overline{Y}_{L1Bg} + \overline{Y}_{L2Bg} + \overline{Y}_{L3Bg}$$

$$\overline{Y}_{L1Bg} = G_{L1Bg} + j \cdot B_{L1Bg}$$

$$\overline{Y}_{L2Bg} = G_{L2Bg} + j \cdot B_{L2Bg}$$

$$\overline{Y}_{L3Bg} = G_{L3Bg} + j \cdot B_{L3Bg}$$

$G_{L1Bg}$=Phase-to-earth conductance of phase L1 of the background network
$G_{L2Bg}$=Phase-to-earth conductance of phase L2 of the background network
$G_{L3Bg}$=Phase-to-earth conductance of phase L3 of the background network
$B_{L1Bg}$=Phase-to-earth susceptance of phase L1 of the background network
$B_{L2Bg}$=Phase-to-earth susceptance of phase L2 of the background network
$B_{L3Bg}$=Phase-to-earth susceptance of phase L3 of the background network $$\overline{Y}_{CC} = G_{CC} - j \cdot B_{CC}$$

$G_{CC}$=Conductance of the earthing arrangement (compensation coil plus parallel resistor)
$B_{CC}$=Susceptance of the earthing arrangement (compensation coil)
$G_{CC}$ is the conductance of the resistor, which is connected in parallel with the compensation coil in case of compensated networks. In case of resistor earthed networks $B_{CC}$=0 and $G_{CC}$ is the conductance of the earthing resistor. In case of an unearthed network $\overline{Y}_{CC}$=0. The admittance protection characteristic should be set so that the measured neutral admittance during an inside fault moves outside the operation characteristics (=protection operates). An inside fault means that the fault is located inside the protected electric line 30.

If in a compensated network and when the compensation coil is adjusted to a resonance ($B_{CC}=B_{Bgtot}+B_{Fdtot}$), the measured neutral admittance calculated with delta quantities is:

$$\overline{Y}_{0\Delta} = (G_{Bgtot} + G_{CC}) - j \cdot B_{Fdtot} \qquad (8)$$

This discrimination of the outside and inside fault may be difficult as an imaginary part of measured neutral admittance is the same in both cases. Secure and reliable protection can specify that resistive current is increased during the fault by the use of a parallel resistor. Neutral admittance calculation can then measure the conductance of the parallel resistor. Therefore, in an exemplary embodiment the discrimination can be done on the basis of conductance.

According to an embodiment, once the neutral admittance, or a quantity indicative thereof, has been determined e.g. on the basis of equation 1, it is compared to a predetermined operation characteristic to detect a phase-to-earth fault on the three-phase electric line 30. In an exemplary embodiment, the predetermined operation characteristic, when presented on an admittance plane, defines a closed area such that the centre of the closed area is offset from the origin of the admittance plane towards a negative susceptance direction and/or towards a negative conductance direction. The comparison of the determined neutral admittance, or the quantity indicative thereof, to a predetermined operation characteristic to detect a phase-to-earth fault on the three-phase electric line can include determining whether the neutral admittance is inside or outside of said closed area defined by the predetermined operation characteristic on the admittance plane, and detecting a phase-to-earth fault on the three-phase electric line when the determined neutral admittance is determined to be outside of said closed area defined by the predetermined operation characteristic on the admittance plane. In other words, the closed area is a non-operation area in which the protection does not operate, and the area outside the closed area is an operation area in which the protection operates i.e. a phase-to-earth fault is detected on the three-phase electric line 30.

According to another exemplary embodiment, the closed area is defined by a circle or an ellipse whose centre point is offset from the origin of the admittance plane towards the negative susceptance (B) direction and/or towards the negative conductance (G) direction.

Figure 4:
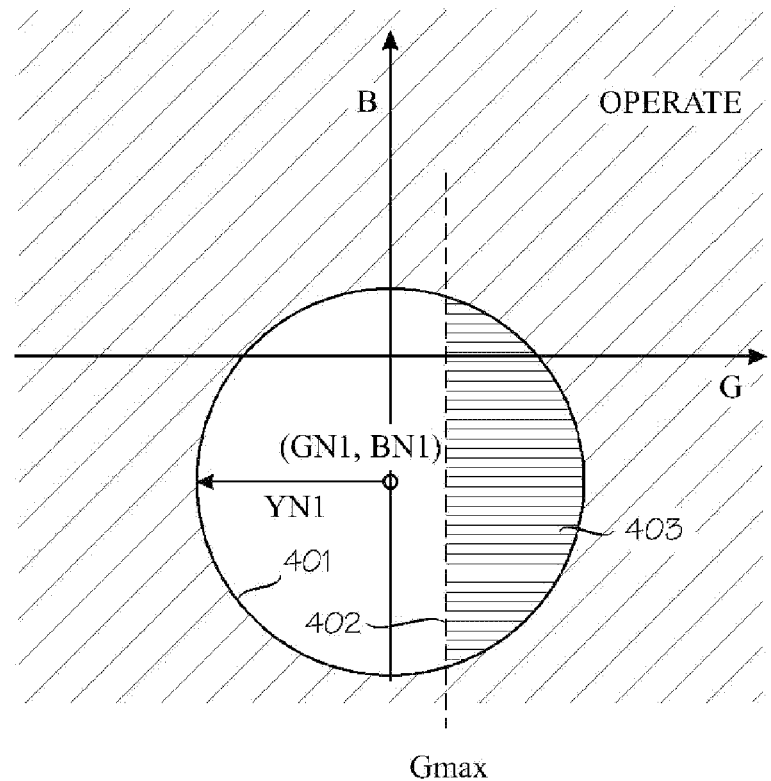
FIG. 4 illustrates an operation characteristic in accordance with an exemplary embodiment.

FIG. 4 illustrates an operation characteristic in accordance with an exemplary embodiment. The operation characteristic comprises a circle 401, which is set-off from the admittance plane origin by settings GN1 and BN1. The circle radius is defined by setting YN1. Operation of the protection can be achieved when the determined neutral admittance moves outside the closed area defined by the circle 401. In mathematical form this can be expressed as follows:

$$\text{real}(\overline{Y}_{0\Delta}) - GN1)^2 + (\text{imag}(\overline{Y}_{0\Delta}) - BN1)^2 - YN1 \cdot YN1 > 0, \qquad (9)$$

where $\overline{Y}_{0\Delta}$ is the measured neutral admittance.

The settings GN1, BN1 and YN1 should be selected such that the admittance corresponding to the electric line 30 length ($\overline{Y}_{Fdtot}$) is within the closed area with a suitable safety margin. The smaller the circle, the more sensitive the protection. If the connection state of the electric line 30 to be protected changes, the settings can be adjusted accordingly. This adjustment can be manual or automatic by determining the total line admittance, which includes calculating the neutral admittance based on changes in the residual current and voltage during the healthy state using equation 6. After determining the total line admittance of the present switching state using equation 6, the settings GN1, BN1 and YN1 can be updated according to the following criteria:

$$BN1 = -\text{imag}(\overline{Y}_{Fdtot})$$

$$GN1 = -\text{real}(\overline{Y}_{Fdtot})$$

$$YN1 = r \cdot \text{imag}(\overline{Y}_{Fdtot})$$

r=factor defining the marginal (sensitivity) of the protection, r>0. In FIG. 4, r=1.5, which is a user defined setting parameter According to another embodiment, the closed area can be defined by a circle whose center point is offset from the origin of the admittance plane towards the negative susceptance direction and/or towards the negative conductance direction such that a segment of the circle can be excluded from the closed area which segment is defined by a line defined by a predetermined conductance value. In other words, in practical applications the offset admittance circle 401 can be combined with one or more "classical" boundary lines, e.g. with a forward directional conductance boundary line 402 as illustrated in FIG. 4. The value for $G_{max}$ can be obtained from parallel resistor conductance: $G_{max}=k*G_{CC}$, where k=0 . . . 1 safety margin. In exemplary embodiments, the value can be any suitable number, and more preferably the value for k can be 0.8. In this case, the shaded segment 403 of the circle 401 can be excluded from the closed area and thus belongs to the operation area surrounding the closed non-operation area. If the network is a compensated one and $|YN1|>|G_{CC}|$, $G_{max}$ can be set and used. However, if the compensation coil and parallel resistor are disconnected, this setting need not be changed.

Figure 5:
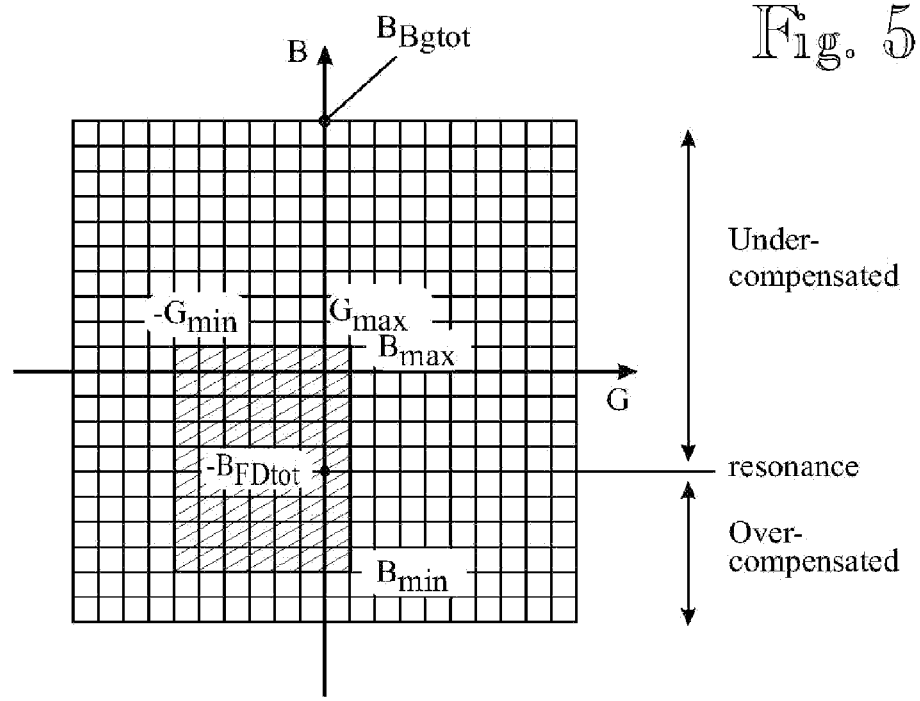
FIG. 5 illustrates an operation characteristic in accordance with an exemplary embodiment.

According to an exemplary embodiment of the present disclosure, the closed area is a polygon having three or more sides defined by three or more lines, respectively. FIG. 5 illustrates an operation characteristic in accordance with an exemplary embodiment. As shown in FIG. 5, the operation characteristic is an off-set rectangle (the shaded area), whose reach is defined by settings $B_{min}$, $B_{max}$ and $G_{mm}$, $G_{max}$ which define lines forming the sides of the rectangle. This operation scheme can specify more setting parameters, offer more flexibility, and can be useful in case of problematic network configurations. In practice, the G settings relate to the network components causing resistive current in the network such as a possible compensation coil and its parallel resistor. In case of a compensated network when the fault is in the protected electric line, the admittance determination detects:

$$\overline{Y}_{0\Delta}=\overline{Y}_{Bgtot}+\overline{Y}_{CC}=(G_{Bgtot}+j \cdot B_{Bgtot})+(G_{CC}-j \cdot B_{CC})$$

With $G_{CC}>>G_{Bgtot}$, the following approximation is valid in practice:

$$\overline{Y}_{0\Delta} \approx G_{CC}+j \cdot (B_{Bgtot}-B_{CC})$$

The imaginary part of the measured admittance can be due to the term $G_{CC}$ caused by the parallel resistor of the compensation coil. Thus, the settings $G_{min}$ and $G_{max}$ can be selected such that $G_{cc}$ is outside the range defined by $G_{min}$ and $G_{max}$. A suitable safety margin can be used as desired. The settings $B_{min}$ and $B_{max}$ may be selected e.g. to correspond to the minimum and maximum switching situations of the electric line 30 to be protected. Again, any suitable safety margin can be used as desired.

One option is to determine parameters of a polygon shape admittance criterion by utilizing calculated neutral admittance based on changes in the residual current and voltage during the healthy state using equation 6. After determining the total line admittance of the present switching state using equation 6, then settings $G_{min}$, $G_{max}$, $B_{min}$ and $B_{max}$ can be determined using the following formulae:

$G_{max}$=The value for $G_{max}$ can be obtained from parallel resistor conductance: $G_{max}=k*G_{CC}$, where k=0 . . . 1 is a safety margin, preferably a value for k is 0.8, $G_{min}=d*\text{imag}(\overline{Y}_{Fdtot})$, where d is a factor defining the marginal (sensitivity) of the protection. d>0, in FIG. 5, d=1.5, $B_{min}=q1*\text{imag}(\overline{Y}_{Fdtot})$, where q1 is a factor defining the marginal (sensitivity) of the protection. q1>0, in FIG. 5, d=1.0, $B_{max}=q2*\text{imag}(\overline{Y}_{Fdtot})$, where q2 is a factor defining the marginal (sensitivity) of the protection. q2>0, in FIG. 5, d=1.25, where d, q1, q2 are user defined setting parameters.

A benefit of the various suggested operation characteristics is that they can be applied to unearthed, high resistance earthed and also compensated networks. Also the number of settings can be minimized. In addition, the setting procedure can be simple as B-axis settings and can be calculated on the basis of earth fault current supplied by the electric line using equation 5 and G-axis settings can be based on a rated value of earthing/parallel resistor current $I_{GCC}$: $(G_{min}=k \cdot I_{GCC}/U_{phase})$, where for example: $I_{GCC}$=5 A, $U_{phase}$=20000/sqrt(3) volts, k=0.5: $G_{min}$=0.22 milliSiemens. Alternatively, settings can be determined utilizing changes during the healthy state and using equation 6.

According to an exemplary embodiment, the fault resistance can be simultaneously (during a fault inside the electric line) estimated with the equation:

$$\overline{Y}_F = \frac{3 \cdot \overline{I}_{0\Delta} - \overline{U}_{0\Delta} \cdot \overline{Y}_{Fdtot}}{\overline{U}_{L\_fault}} \Rightarrow R_F = \frac{1}{\text{real}(\overline{Y}_F)}, \quad (10)$$

where $U_{L\_fault}$ is the phase-to-earth voltage of the faulted phase during a fault.

Equation 10 uses the same measured quantities and the settings $\overline{Y}_{0Fdtot}=G_{Fdtot}+j \cdot B_{Fdtot}$ as the protection. In another exemplary embodiment the fault resistance can be calculated through the fault admittance with delta method utilizing changes during the fault:

$$\overline{Y}_F = \frac{3 \cdot (\overline{I}_{0\_f2} - \overline{I}_{0\_f1})}{-(\overline{U}_{0\_f2} - \overline{U}_{0\_f1})} - \overline{Y}_{Fdtot} \Rightarrow R_F = \frac{1}{\text{real}(\overline{Y}_F)}, \quad (11)$$

here f1 and f2 refer to two separate instances in time during the fault, before (f1) and after (f2) the change. This change can be due to, e.g., altering the compensation coil tuning or switching of the parallel resistor of the compensation coil (on or off).

According to an exemplary embodiment, also a faulted phase can be identified by calculating fault resistance estimates simultaneously for each phase:

$$R_{F\_L1} = \text{real}\left(\frac{\overline{U}_{L1\_fault}}{3 \cdot \overline{I}_{0\Delta} - \overline{U}_{0\Delta} \cdot \overline{Y}_{Fdtot}}\right)$$

$$R_{F\_L2} = \text{real}\left(\frac{\overline{U}_{L2\_fault}}{3 \cdot \overline{I}_{0\Delta} - \overline{U}_{0\Delta} \cdot \overline{Y}_{Fdtot}}\right)$$

$$R_{F\_L3} = \text{real}\left(\frac{\overline{U}_{L3\_fault}}{3 \cdot \overline{I}_{0\Delta} - \overline{U}_{0\Delta} \cdot \overline{Y}_{Fdtot}}\right)$$

In this exemplary embodiment phase selection logic can be suggested as follows: in case only one out of the three fault resistance estimates provides a positive value, this positive value represents the faulted phase with a corresponding fault resistance value. In case two out of the three fault resistance estimates provides positive values, the faulted phase is selected based on comparing the phase voltage magnitudes between the two positive values where: the faulted phase is the phase with a lower phase voltage value.

Figure 6:
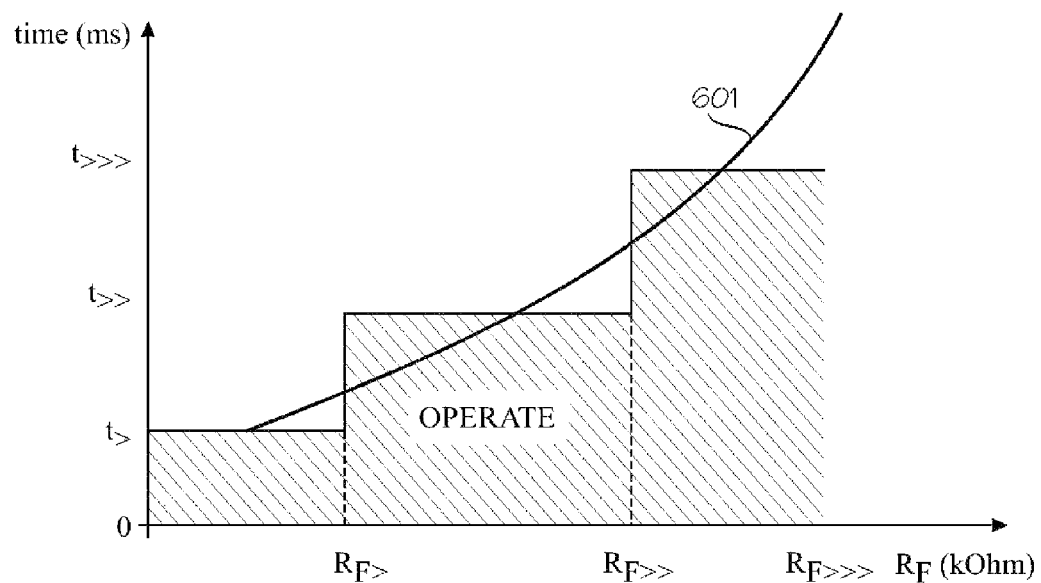
FIG. 6 illustrates a diagram implementing several protection stages in accordance with an exemplary embodiment.

According to an exemplary embodiment, a multi-stage admittance protection concept can be implemented. When the faulted electric line is detected on the basis of the admittance criteria, the fault resistance estimate can be used to define operation speed. Multiple fault resistance thresholds (protection stages) can be implemented. Different stages could be set e.g. at RF>, RF>>, RF>>>, RF>>>> with corresponding protection operation delays t>, t>>, t>>> and t>>>>. This embodiment is illustrated in FIG. 6, which shows how an inverse type operation curve 601 is formed along with such protection stages.

An exemplary apparatus according to any one of the above embodiments, or a combination thereof, can be implemented as one unit or as two or more separate units that are configured to implement the functionality of the various embodiments. As provided herein, the term 'unit' refers generally to a physical or logical entity, such as a physical device or a part thereof or a software routine. One or more of these units can reside in a protective relay device or equipment, or any other suitable device as desired. An apparatus according to an exemplary embodiment can comprise a monitoring unit configured to monitor a zero sequence current on the three-phase electric line and a zero sequence voltage in the electric network, a detection unit configured to detect an earth fault in the electric network on the basis of the zero sequence voltage value, and a determination unit configured to determine a difference between the zero sequence current before the earth fault and the zero sequence current during the earth fault. The determination unit determines a difference between the zero sequence voltage before the earth fault and the zero sequence voltage during the earth fault, and to determine a neutral admittance, or a quantity indicative thereof, on the basis of a ratio between the difference between the zero sequence currents and the difference between the zero sequence voltages. The apparatus also includes a comparison unit configured to compare the determined neutral admittance, or the quantity indicative thereof, to a predetermined operation characteristic to detect a phase-to-earth fault on the three-phase electric line.

An apparatus according to any one of the exemplary embodiments of the present disclosure can be implemented by means of a computer or corresponding digital signal processing equipment provided with suitable software, or other suitable device as desired. Such a computer or digital signal processing equipment comprise at least a working memory (RAM) providing storage area for arithmetical operations and a central processing unit (CPU), such as a general-purpose digital signal processor. The CPU can comprise a set of registers, an arithmetic logic unit, and a control unit. The control unit can be controlled by a sequence of program instructions transferred to the CPU from the RAM. The control unit can contain a number of microinstructions for basic operations. The implementation of microinstructions can vary depending on the CPU design. The program instructions can be coded by a programming language, which can be a high-level programming language, such as C, Java, a low-level programming language, such as a machine language, an assembler or other suitable programming language as desired. The computer can also have an operating system which can provide system services to a computer program written with the program instructions. The computer or other apparatus implementing the disclosure further comprises suitable input means for receiving e.g. measurement and/or control data, which input means thus enable, e.g., the monitoring of current and voltage quantities, and output means for outputting, e.g., fault alarms and/or control data for controlling protection equipment such as switches, disconnectors and circuit-breakers. Integrated circuit or circuits, and/or discrete components and devices can be used for implementing the functionality according to any one of the embodiments.

The exemplary embodiments of the present disclosure can be implemented in existing system elements, such as various protective relays or similar devices, or by using separate dedicated elements or devices in a centralized or distributed manner. Known protective devices for electric systems, such as protective relays, comprise processors and memory that can be configured to execute the functions according to embodiments of the disclosure. Thus, all modifications and configurations specify for implementing an embodiment of the disclosure e.g. in existing protective devices can be performed as software routines, which can be implemented as added or updated software routines.

If the functionality of the disclosure is implemented in software, such software can be provided as a computer readable medium that is tangible and comprises computer program code recorded thereon which, when the computer readable medium is in communication with a processor the program code can be executed and cause the computer or corresponding arrangement to perform the functionality according to the exemplary embodiments of the present disclosure as described above. Such a computer program code may be stored or generally embodied on a computer readable medium, such as suitable memory, e.g. a flash memory or a disc memory from which it is loadable to the unit or units executing the program code. In addition, such a computer program code implementing exemplary embodiments of the present disclosure can be loaded to the unit or units executing the computer program code via a suitable data network, for example, and it can replace or update a possibly existing program code.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for detecting a phase-to-earth fault on a three-phase electric line of an electric network, the method comprising:

monitoring a zero sequence current on the three-phase electric line and a zero sequence voltage in the electric network;

detecting an earth fault in the electric network based on a value of the zero sequence voltage;

determining a difference between a first zero sequence current monitored before the earth fault and a second zero sequence current monitored during the earth fault;

determining a difference between a first zero sequence voltage value monitored before the earth fault and a second zero sequence voltage value monitored during the earth fault;

determining a neutral admittance, based on a ratio between the difference between the first and second zero sequence currents and the difference between the first and second zero sequence voltages; and comparing the determined neutral admittance, to a predetermined operation characteristic to detect a phase-to-earth fault on the three-phase electric line, wherein the predetermined operation characteristic, when presented on an admittance plane, defines a closed area such that the center of the closed area is offset from the origin of the admittance plane towards a negative susceptance direction and/or towards a negative conductance direction.

2. The method of claim 1, wherein the comparing the determined neutral admittance, to a predetermined operation characteristic to detect a phase-to-earth fault on the three-phase electric line comprises:
  determining whether the neutral admittance is inside or outside said closed area defined by the predetermined operation characteristic on the admittance plane; and
  detecting a phase-to-earth fault on the three-phase electric line when the determined neutral admittance is determined to be outside said closed area defined by the predetermined operation characteristic on the admittance plane.

3. The method of claim 1, wherein the closed area is defined by a circle or an ellipse having a center point that is offset from the origin of the admittance plane towards the negative susceptance direction and/or towards the negative conductance direction.

4. The method of claim 1, wherein the closed area is defined by a circle whose center point is offset from the origin of the admittance plane towards the negative susceptance direction and/or towards the negative conductance direction such that a segment of the circle is excluded from the closed area, which segment is defined by a line defined by a predetermined conductance value.

5. The method of claim 1, wherein the closed area is a polygon having three or more sides defined by three or more lines respectively.

6. The method of claim 1, comprising:
  updating the predetermined operation characteristic when the switching state of the three-phase electric line changes or at predetermined intervals.

7. A non-transitory computer readable medium comprising computer program code, wherein the execution of the program code in a computer causes the computer to carry out the steps of the method according to claim 1.

8. An apparatus for detecting a phase-to-earth fault on a three-phase electric line of an electric network, the apparatus comprising:
  means for monitoring a zero sequence current on the three-phase electric line and a zero sequence voltage in the electric network;
  means for detecting an earth fault in the electric network based on the zero sequence voltage value;
  means for determining a difference between a first zero sequence current before the earth fault and a second zero sequence current during the earth fault;
  means for determining a difference between a first zero sequence voltage before the earth fault and a second zero sequence voltage during the earth fault;
  means for determining a neutral admittance, based on a ratio of the difference between the first and second zero sequence currents and the difference between the first and second zero sequence voltages; and
  means for comparing the determined neutral admittance to a predetermined operation characteristic to detect a phase-to-earth fault on the three-phase electric line, wherein the predetermined operation characteristic, when presented on an admittance plane, defines a closed area such that a center of the closed area is offset from an origin of the admittance plane towards a negative susceptance direction and/or towards a negative conductance direction.

9. The apparatus of claim 8, wherein the means for comparing the determined neutral admittance, to a predetermined operation characteristic to detect a phase-to-earth fault on the three-phase electric line comprises:
  means for determining whether the neutral admittance is inside or outside said closed area defined by the predetermined operation characteristic on the admittance plane; and
  means for detecting a phase-to-earth fault on the three-phase electric line when the determined neutral admittance is determined to be outside said closed area defined by the predetermined operation characteristic on the admittance plane.

10. The apparatus of claim 8, wherein the closed area is defined by a circle or an ellipse having a center point that is offset from the origin of the admittance plane towards the negative susceptance direction and/or towards the negative conductance direction.

11. The apparatus of claim 8, wherein the closed area is defined by a circle whose center point is offset from the origin of the admittance plane towards the negative susceptance direction and/or towards the negative conductance direction such that a segment of the circle is excluded from the closed area which segment is defined by a line defined by a predetermined conductance value.

12. The apparatus of claim 8, wherein the closed area is a polygon having three or more sides defined by three or more lines respectively.

13. The apparatus of claim 8, the apparatus comprising means for updating the predetermined operation characteristic when the switching state of the three-phase electric line changes or at predetermined intervals.

14. The apparatus of claim 8, the apparatus comprising a protective relay.

15. An apparatus for detecting a phase-to-earth fault on a three-phase electric line of an electric network, the apparatus comprising:
  a monitoring unit configured to monitor a zero sequence current on the three-phase electric line and a zero sequence voltage in the electric network;
  a detection unit configured to detect an earth fault in the electric network based on the zero sequence voltage value;
  a determination unit configured to:
    determine a difference between a first zero sequence current before the earth fault and a second zero sequence current during the earth fault,
    determine a difference between a first zero sequence voltage before the earth fault and a second zero sequence voltage during the earth fault, and
    determine a neutral admittance, based on a ratio of the difference between the first and second zero sequence currents and the difference between the first and second zero sequence voltages; and
  a comparison unit configured to compare the determined neutral admittance, to a predetermined operation characteristic to detect a phase-to-earth fault on the three-phase electric line, wherein the predetermined operation characteristic, when presented on an admittance plane, defines a closed area such that a center of the closed area is offset from an origin of the admittance plane towards a negative susceptance direction and/or towards a negative conductance direction.

* * * * *